(12) United States Patent
Ohtomo

(10) Patent No.: US 9,639,116 B2
(45) Date of Patent: May 2, 2017

(54) DISPLAY DEVICE

(71) Applicant: CANON KABUSHIKI KAISHA, Tokyo (JP)

(72) Inventor: Ryo Ohtomo, Chigasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/001,975

(22) Filed: Jan. 20, 2016

(65) Prior Publication Data

US 2016/0216729 A1 Jul. 28, 2016

(30) Foreign Application Priority Data

Jan. 22, 2015 (JP) ................................. 2015-010397
Dec. 28, 2015 (JP) ................................. 2015-256526

(51) Int. Cl.
*G06F 1/16* (2006.01)
*G02F 1/13* (2006.01)
*G02F 1/1333* (2006.01)
*H05K 5/00* (2006.01)
*H05K 5/02* (2006.01)

(52) U.S. Cl.
CPC ...... *G06F 1/1601* (2013.01); *G02F 1/133308* (2013.01); *H05K 5/0017* (2013.01); *H05K 5/0217* (2013.01); *G02F 2001/13332* (2013.01); *G02F 2001/133314* (2013.01); *G02F 2201/503* (2013.01); *G02F 2201/54* (2013.01)

(58) Field of Classification Search
CPC ........... G02F 1/133308; G02F 2201/50; G02F 2201/503; G02F 2201/54; G06F 1/1637
See application file for complete search history.

(56) References Cited

U.S. PATENT DOCUMENTS

| 5,659,376 A * | 8/1997 | Uehara ............. G02F 1/133308 348/794 |
| 5,666,261 A * | 9/1997 | Aguilera ................... B32B 3/12 165/185 |
| 6,181,555 B1 * | 1/2001 | Haley ................... G06F 1/1616 361/679.21 |
| 6,560,124 B1 * | 5/2003 | Irie .......................... H05K 5/02 174/377 |

(Continued)

OTHER PUBLICATIONS

European Search Report issued on Jun. 22, 2016, that issued in the corresponding European Patent Application No. 16151807.1.

*Primary Examiner* — Adrian S Wilson
(74) *Attorney, Agent, or Firm* — Cowan, Liebowitz & Latman, P.C.

(57) ABSTRACT

A display device has a display panel; a first holding member holding a plurality of sides of the display panel from a front surface side; a first shock-absorbing member disposed between the front surface side of the display panel and the first holding member, at least at a side of a lower end section of the display panel; a second holding member holding the plurality of the sides from the rear surface side; a second shock-absorbing member disposed between the rear surface side of the display panel and the second holding member, at least at the side of the lower end section of the display panel; and a supporting member supporting a portion of the lower end section. The force against the display panel from the first shock-absorbing member and the second shock-absorbing member is smaller in the vicinity of the supporting member than in other portions.

17 Claims, 19 Drawing Sheets

(56) References Cited

U.S. PATENT DOCUMENTS

| | | | |
|---|---|---|---|
| 6,859,357 B2* | 2/2005 | Morimoto | G06F 1/1616 |
| | | | 248/917 |
| 7,936,414 B2* | 5/2011 | Hsiao | G02F 1/133308 |
| | | | 345/87 |
| 8,144,453 B2* | 3/2012 | Brown | G06F 3/0414 |
| | | | 345/173 |
| 9,329,419 B2* | 5/2016 | Ohtomo | G02F 1/133308 |
| 2003/0020679 A1 | 1/2003 | Kojima et al. | |
| 2005/0057703 A1 | 3/2005 | Tsubokura et al. | |
| 2007/0182877 A1* | 8/2007 | Tanokuchi | H05K 5/02 |
| | | | 349/58 |
| 2013/0188301 A1 | 7/2013 | Tanaka | |
| 2016/0270244 A1* | 9/2016 | Ohtomo | H05K 5/0017 |

* cited by examiner

DISPLAY DEVICE

BACKGROUND OF THE INVENTION

Field of the Invention

The present invention relates to a display device.

Description of the Related Art

In a display panel, such as a liquid, crystal panel or organic electroluminescence (EL) panel, display elements, such as liquid crystal or organic light-emitting elements, are provided between two glass substrates on which thin film devices are formed.

A conventional structure is now described with reference to FIG. 12 and FIG. 13. A display device 1 equipped with a display panel 2 is configured by disposing a base 7, which is metal case in which a display panel 2 is accommodated, or to which a display panel 2 is bonded, on the opposite side to a display surface, and covering the display surface side with a metal frame 3. A display device 1 in which the display panel 2 is a liquid crystal display panel is provided with a liquid crystal display panel and a backlight unit 5 which illuminates the liquid crystal display panel. Optical sheets which concentrate light are provided in the backlight unit 5. The backlight unit 5 also includes a substrate, a light source and a reflection sheet, etc. In order to maintain a certain space between the display panel 2 and the optical sheets, and also to hold the liquid crystal display panel itself, a panel holder 4 is arranged so as to cover the periphery and rear surface of the display panel 2. The panel holder 4 is commonly made of resin. The panel holder 4 has a panel supporting section 40 which supports the lower end section of the display panel 2. The display panel 2 is sandwiched between the frame 3 which is disposed on the front surface of the display panel 2, and the panel holder 4, via a front surface elastic body and a rear surface elastic body, such as cushions. The front surface elastic body and the rear surface elastic body are arranged on the four edges of the display panel 2. The front surface elastic body is configured by a lower edge rear surface elastic body 10, a left edge rear surface elastic body 15, a right edge rear surface elastic body 16 and an upper edge rear surface elastic body 17, and the like.

On the other hand, when a concentration of stress occurs in the display surface of the display panel 2, then the brightness uniformity and chromaticity uniformity, etc. of the screen declines locally. This is known as display non-uniformity. For example, in the case of a liquid crystal display panel, when concentration of stress occurs, the orientation of the liquid crystals is forcibly disturbed, the voltage application control does not function adequately, and therefore a display non-uniformity 9 such as that shown in FIG. 11 occurs.

Japanese Patent Application Publication No. 2009-92716 discloses a structure which alleviates stress that is applied to the display panel by varying the physical properties of the material of the holding member, which holds the display panel, in a direction perpendicular to the display surface (thickness direction).

SUMMARY OF THE INVENTION

In a display device provided with a display panel, warping may occur at the four corners of the display panel due to change in the usage environment, such as the temperature and/or humidity, etc. One cause of warping is the properties of the polarizing plates which are bonded to the front surface and rear surface of the display panel. For example, warping occurs in the display panel due to differences between the front surface and rear surface in the rate of expansion and/or rate of contraction of the polarizing plates and differences in the direction of expansion and/or contraction. Moreover, warping may also occur due to variation in thermal expansion as a result. of temperature difference between the front surface and rear surface of the display panel 2.

In the prior art technology described above, a frictional force 41 occurs in the vicinity of the panel supporting section 40 when warping occurs in the display panel 2. Furthermore, since the lower edge front surface elastic body 30 is compressed, then a front surface holding force 42 which acts on the display panel 2 from the front surface side occurs. Since the lower edge rear surface elastic body 10 is compressed, then a rear surface holding force 43 which acts on the display panel 2 from the rear surface side also occurs. In this way, as a result of the warping of the display panel 2, various stresses act on the display panel 2. Accordingly, the stress concentrates locally in the display panel 2 in the vicinity of the supporting section and there is a problem in that display non-uniformities occur.

Furthermore, in Japanese Patent Application Publication No. 2009-92716, a material which has differing properties in the thickness direction is used uniformly in the edge direction, and therefore the display panel is moved to a position displaced from the optimal position in the thickness direction of the display panel. Therefore, the panel holding force is weak and if an external force is applied to the surface of the liquid crystal panel, then the amount of deformation of the display panel and the stress on the display panel become large and display non-uniformities are liable to occur.

In view of these issues, the present invention suppresses the occurrence of display non-uniformities when warping has occurred in the display panel of a display device.

A first aspect of the present invention is a display device, including: a display panel; a first holding member which holds a plurality of sides of the display panel from a front surface side; a first shock-absorbing member which is disposed between the front surface side of the display panel and the first holding member, at least at a side of a lower end section of the display panel; a second holding member which holds the plurality of the sides of the display panel from a rear surface side; a second shock-absorbing member which is disposed between the rear surface side of the display panel and the second holding member, at least at the side of the lower end section of the display panel; and a supporting member which supports a portion of the lower end section of the display panel; wherein a force against the display panel from the first shock-absorbing member and the second shock-absorbing member is smaller in a vicinity of the supporting member than in other portions.

According to the present invention, it is possible to suppress the occurrence of display non-uniformities when warping has occurred in the display panel of a display device.

Further features of the present invention will become apparent from the following description or exemplary embodiments with reference to the attached drawings.

DESCRIPTION OF THE EMBODIMENTS

First Embodiment

Below, a first embodiment of the present invention is described with reference to the drawings.

Figure 1:
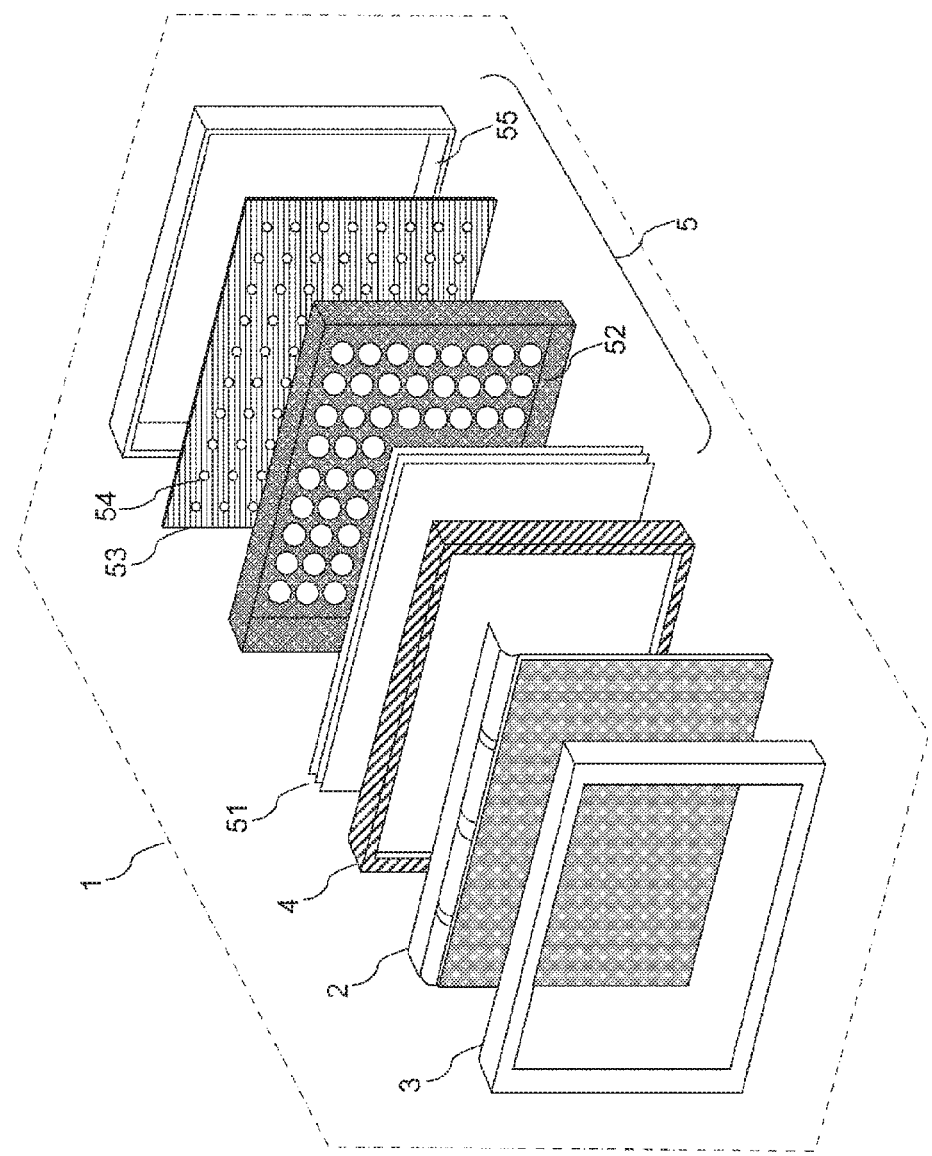
FIG. 1 is an exploded perspective diagram showing a schematic view of the whole display device according to a first embodiment.

FIG. 1 is an exploded perspective diagram showing a schematic view of the whole display device according to the first embodiment. The display device 1 is configured by a frame 3, a display panel 2, a panel holder 4, optical sheets 51, a reflection sheet 32, a substrate 53, and a case 35. The display panel 2 is a liquid crystal panel, organic EL panel, micro electro mechanical systems (MEMS) panel, or the like. The frame 3 is a first holding member which holds the periphery of the display region of the display panel 2, from the front surface side. The frame 3 is made of metal, for example, and is formed by a pressing or mechanical process, but may also be a resin molding. The panel holder 4 is a second holding member which holds the periphery of the display region of the display panel 2, from the rear surface side. The panel holder 4 is desirably formed by a resin molding, but may also be made of a metal material. The panel holder 4 holds and accommodates the display panel 2, so as to maintain a certain space between the display panel 2 and optical sheets 51. The first holding member (the frame 3) may be implemented as a member which holds the plurality of sides of the display panel from the front surface side. The second holding member (the panel holder 4) may be implemented as a member which holds the plurality of sides of the display panel from the rear surface side.

The optical sheets 51 provided inside the backlight unit 5 diffuse the light received from the rear side. The reflection sheet 52 reflects light from a light source. A light source 54, such as a light emitting diode (LED) or cold cathode fluorescent lamp (CCFL) is mounted on the substrate 53. The backlight method may use a direct surface light source and/or edge light source, but the present invention can be applied to a display device using any backlight method. The case 55 accommodates the optical sheets 51, reflection sheet 52 and substrate 53. The display panel 2 is illuminated by a backlight unit 5 which is constituted by these members.

Figure 2:
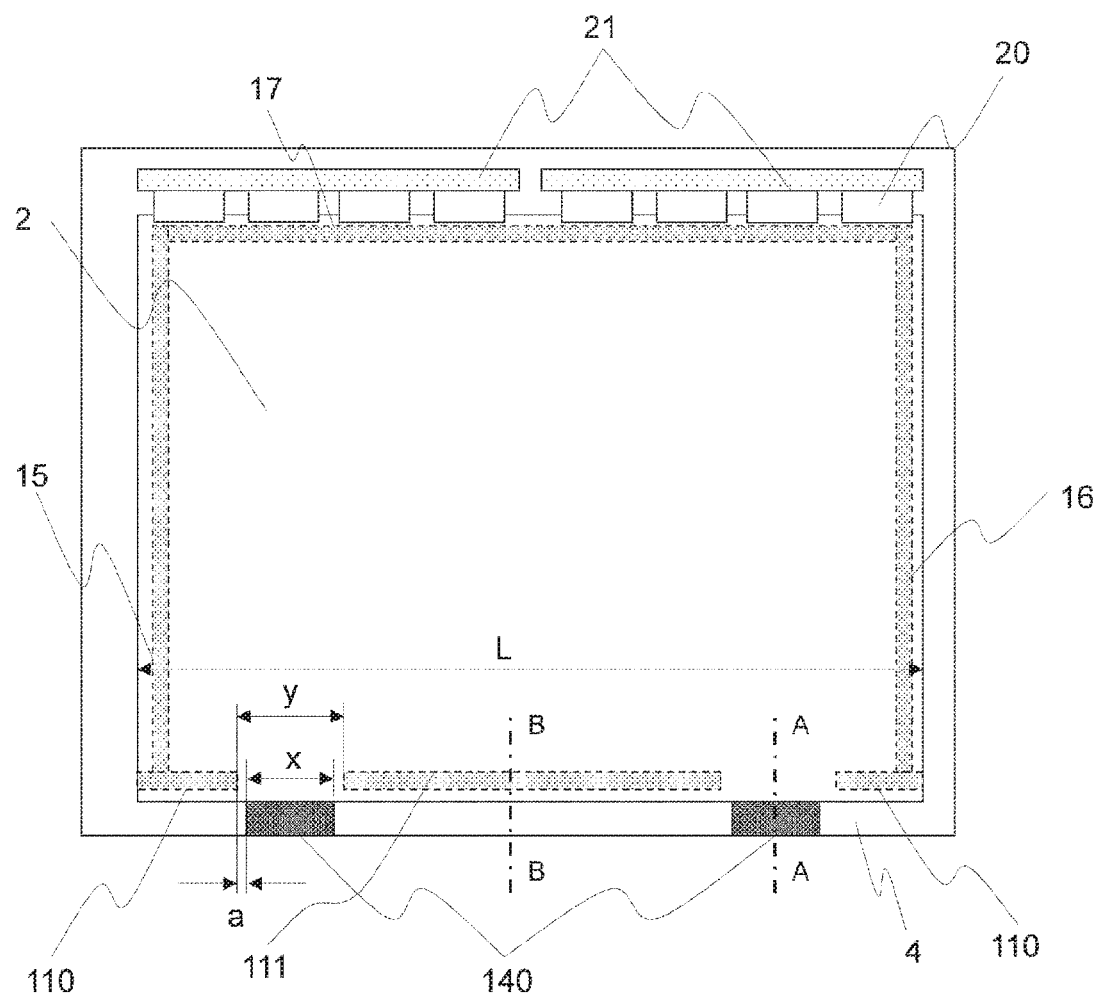
FIG. 2 is front surface diagram showing a schematic view of the display device according to the first embodiment.
Figure 3:
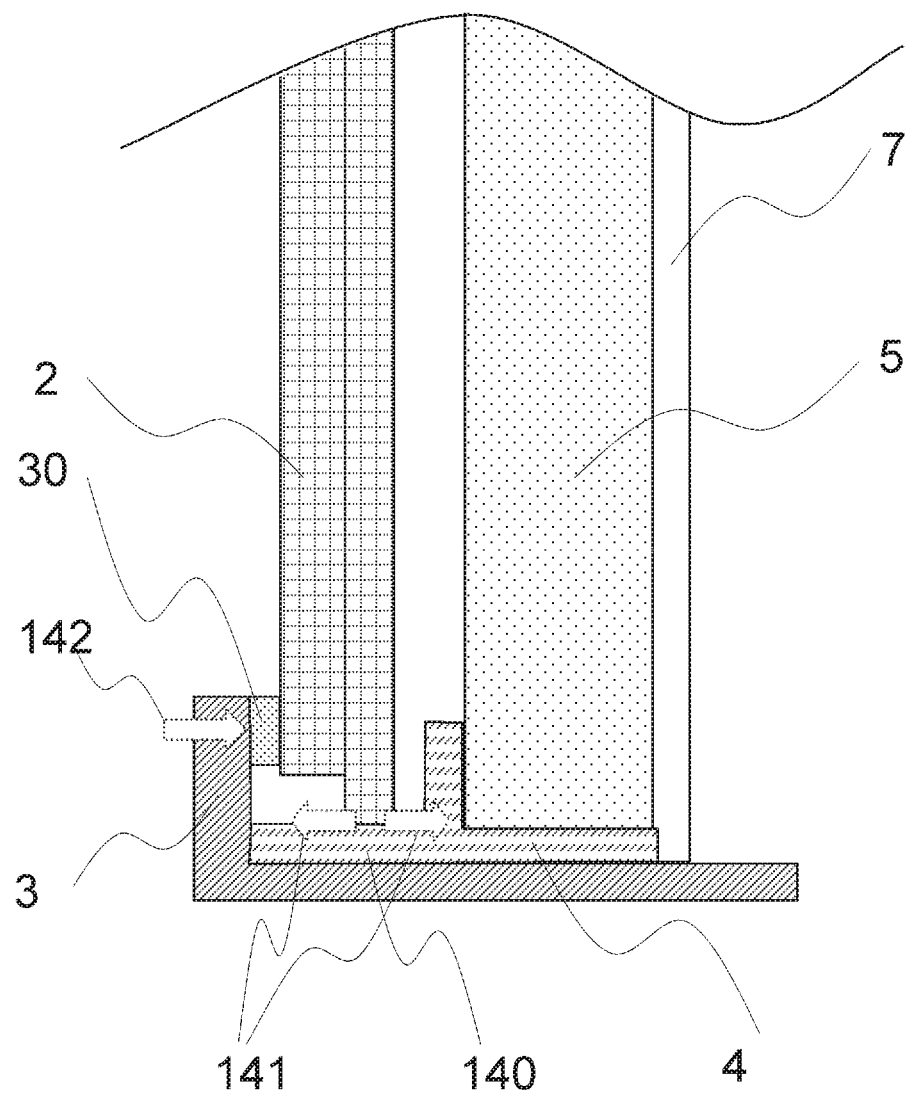
FIG. 3 is a cross-sectional diagram along A-A in FIG. 2, which shows a schematic view of the display device according to the first embodiment.
Figure 4:
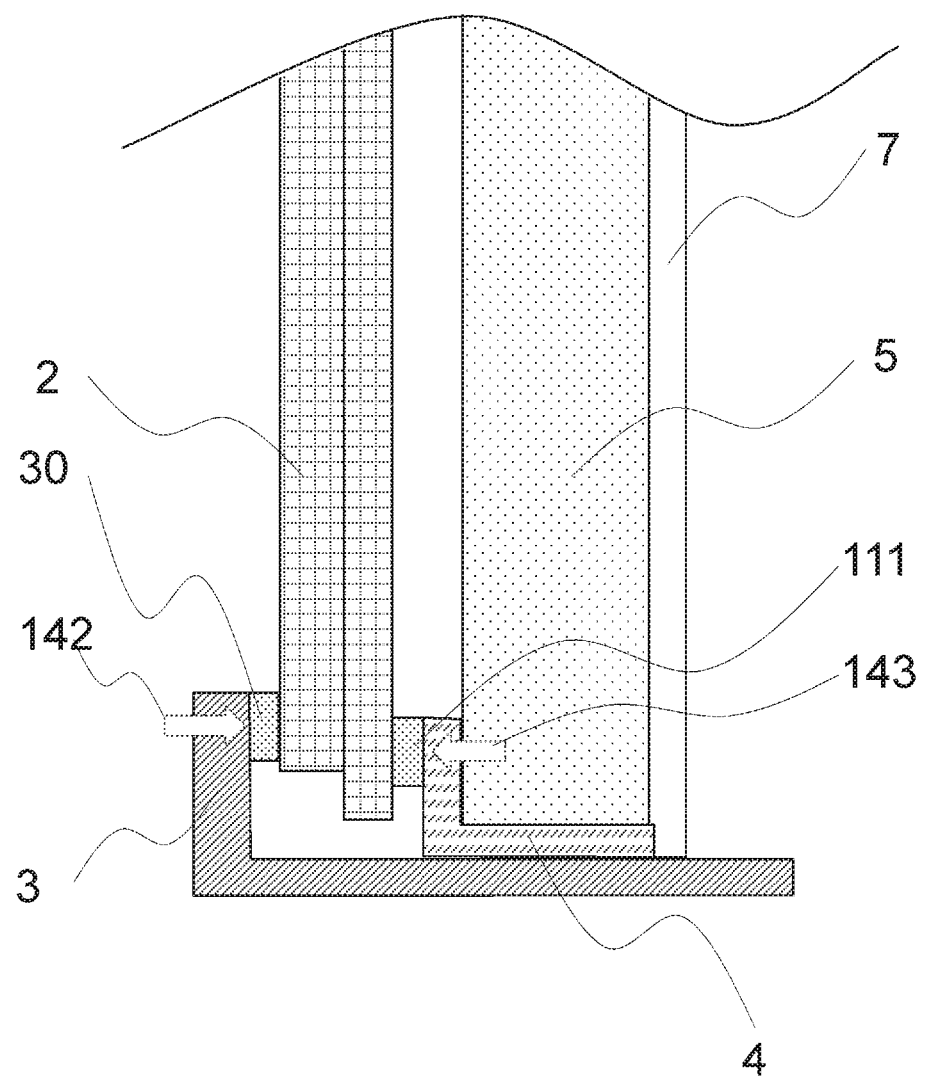
FIG. 4 is a cross-sectional diagram along B-B in FIG. 2, which shows a schematic view of the display device according to the first embodiment.

FIG. 2 is front surface diagram showing a schematic view of the display device according to the first embodiment. FIG. 3 is a diagram showing a schematic view of the display device of the first embodiment, in a cross-sectional view along A-A in FIG. 2. FIG. 4 is a diagram showing a schematic view of the display device of the first embodiment, in a cross-sectional view along B-B in FIG. 2.

As shown in FIG. 2, a panel holder 4 is disposed at the four outer perimeter edges of the rear surface of the display panel 2. Flexible wiring 20 and a drain substrate 21 are connected to the upper end section of the display panel 2, and the display panel 2 is driven thereby. A portion of the lower end section of the display panel 2 is supported from below by the panel supporting section 140 which is configured in an integrated fashion with panel holder 4. In the first embodiment, panel supporting sections 140 are disposed at two different positions along the lower edge. The number of panel supporting sections 140 is not limited to two. The panel supporting sections 140 are supporting members which contact and support a portion of the lower end section of the display panel 2, from below. The length of the panel supporting sections 140 along the lower edge of the display panel 2 can be set in accordance with the lower edge length of the display panel 2, for example. Furthermore, the length of the panel supporting sections 140 may be set in a range of 2 to 200 mm. Moreover, the panel supporting sections 140 may be made of a highly slidable material such as a resin material mixed with a glass filler, or a sheet material which has high sliding properties due to the inclusion of other materials. Therefore, frictional forces caused by external factors arising in the display panel 2 can be reduced.

A frame 3 (not illustrated) is disposed on the front surface of the display panel 2, and front surface elastic bodies are disposed at the four edges of the frame 3. The front surface elastic bodies are first shock-absorbing members which are disposed between the from surface side of the display panel 2 and the frame 3, along the four edges of the display region of the display panel 2. Rear surface elastic bodies for holding the display panel 2 are arranged previously along the four edges of the panel holder 4. The rear surface elastic bodies are second shock-absorbing members which are disposed between the rear surface side of the display panel 2 and the panel holder 4, at the four edges of the display region of the display panel 2. The first shock-absorbing member may be implemented as a member which is disposed between the front surface side of the display panel and the first holding member (the frame 3), at least at a side of the lower end section of the display panel. The second shock-absorbing member may be implemented as a member which is disposed between the rear surface side of the display panel and the second holding member (the panel holder 4), at least at the side of the lower end section of the display panel. In the first embodiment, an exemplary configuration is illustrated in which the display panel, the first shock-absorbing member and the second shock-absorbing member are each formed in a square shape. However, their shapes may not be limited to square shapes. For example, they can be formed in shapes with its upper-left and upper-right corners formed in polygonal shapes or arc shapes.

The rear surface elastic bodies and front surface elastic bodies desirably employ a flexible material, in order to avoid the occurrence of rubbing marks or scratches, etc. on the display panel 2. The thickness of the front surface elastic bodies can be set in accordance with the clearance between the frame 3 and the display panel 2. The thickness of the front surface elastic bodies is desirably approximately 0.5 to 5 mm, and the width thereof is desirably approximately 0.5 to 5 mm. The thickness of the rear surface elastic bodies is desirably approximately 0.5 to 5 mm, and the width thereof is desirably approximately 0.5 to 5 mm. Moreover, the hardness of the rear surface elastic bodies should be equal to or greater than the hardness of the front surface elastic bodies. This is in order to maintain a certain space between the display panel 2 and the optical sheets 51. The rear surface elastic bodies are bonded to the panel holder 4, and the front surface elastic bodies are bonded to the frame 3. However, these elements do not have to be fixed by bonding. By compressing these elastic bodies, the display panel 2 is held by the elastic force acting on the display panel 2 (the elastic force against the display panel 2). The compression ratio is calculated as described below.

[Expression 1]

$$\text{Compression ratio (\%)} = \frac{\text{Amount of compression of elastic body (mm)}}{\text{Thickness of elastic body (mm)}} \times 100$$

Furthermore, as shown in FIG. 2, FIG. 3 and FIG. 4, the first embodiment adopts a structure in which the rear surface elastic body is not arranged in the vicinity of the panel supporting sections 140. The left-edge rear surface elastic body 15, right-edge rear surface elastic body 16 and upper-edge rear surface elastic body 17 are arranged uniformly along the right edge, left edge and upper edge of the rear surface side of the display panel 2. Meanwhile, in the lower-edge rear surface elastic body, lower-edge rear surface elastic body-end parts 110 are arranged at both ends, and a lower-edge rear surface elastic body-center part 111 is arranged in the center thereof, these parts being mutually separate rather than being arranged in uniform fashion along the edge. The length of the portions where the lower-edge rear surface elastic body-end parts 110 and lower-edge rear surface elastic body-central part 111 are not provided on the lower edge (the separation length) can be set in accordance with the length of the panel supporting sections 140. The separation length of the lower-edge rear surface elastic bodies is desirably the length of the panel supporting sections 140 along the edge, plus 0 to 100 mm.

As shown in FIG. 3, when warping occurs in the display panel 2 or an external force is applied thereto, then a frictional force 141 occurs in the vicinity of the panel supporting sections 140. The frictional force 141 depends on the coefficient of friction between the display panel 2 and the panel supporting sections 140, and on the weight of the display panel 2. The causes of warping in the display panel 2 are various, but common examples are changes in the usage environment (ambient temperature, humidity, etc.) or changes in the temperature and humidity, etc. of the display panel 2 with the time of use. Furthermore, the warping direction and/or amount of warping, and the shape of warping, vary with the thickness and size of the display panel 2, and the properties and thickness, etc. of the polarization plates which are bonded to the front surface and rear surface of the display panel 2.

Meanwhile, on the front surface side of the display panel 2, a front surface holding force 142 is applied by the lower-edge front surface elastic body 30 to the display panel 2 due to the elastic force resulting from the compression, but an elastic force resulting from compression does not act from the rear surface side. Therefore, the force acting on the display panel 2 (the force against the display panel 2) from the front surface elastic body and the rear surface elastic body is smaller in the vicinity of the panel supporting sections 140 than in other portions, and hence excessive concentration of stress on the display panel 2 in the vicinity of the panel supporting sections 140 is suppressed. Therefore, local deformations of the display panel 2 become less liable to occur.

Furthermore, since the lower-edge rear surface elastic body-end parts 110 and the lower-edge rear surface elastic body-central part 111 are arranged in the portions apart from the vicinity of the panel supporting sections 140, then a front surface holding force 142 and a rear surface holding force 143 act on the display panel 2. Consequently, the display panel 2 is held in an appropriate position. Even if warping of the panel occurs and an external force acts in the vicinity of the panel supporting sections 140, the display panel 2 is still able to move readily to an appropriate position, which is particularly effective in cases where the display panel 2 moves or warping occurs on the rear surface side.

Below, these effects are described using calculation formulas. In the description given below, the width represents a size in a direction approximately parallel to the display surface of the display panel 2 and perpendicular to the edges (the size of the front surface elastic body and/or the rear surface elastic body in the breadthways direction). The length represents a size in a direction parallel to the display surface of the display panel 2 and in line with the edges (the size of the front surface elastic body and/or the rear surface elastic body in the lengthwise direction). The thickness represents the size in the direction approximately perpendicular to the display surface of the display panel 2.

When the coefficient of friction relating to the frictional force between the display panel 2 and the panel supporting sections 140 is taken to be μ and the vertical resistance force corresponding to the weight of the display panel 2 is taken to be N [N], then the frictional force Fm occurring therebetween is represented by the following formula.

$$Fm = \mu \times N \, [N]$$

The compressive force (front surface) applied to the display panel 2 by the lower-edge front surface elastic body is taken to be Fp [N] and the compressive force (rear surface) applied to the display panel 2 by the lower-edge rear surface elastic body is taken to be Fr [N]. These are forces which hold the display panel 2 from the front and rear sides.

The compressive force (front surface) Fp is determined on the basis of the compressive stress P1 [MPa] which is derived from the compression ratio of the front surface elastic body, the width B1 [mm] of the front surface elastic body and the length L [mm] of the front surface elastic body. Here, the length of the front surface elastic body is equal to the length of the panel in the lateral direction of the panel (hereinafter called the "X direction"), since the front surface elastic body is provided throughout the whole length of the X direction.

The compressive for (rear surface) Fr is determined on the basis of the compressive stress P2 [MPa ] which is derived from the compression ratio of the rear surface elastic body, the width B2 [mm] of the rear surface elastic body and the length (L-2y) [mm] of the rear surface elastic body. Here, the length of the portions where the rear surface elastic body is not provided in the vicinity of the panel supporting sections 140 is taken to be y [mm]. The length of the rear surface elastic body is the length indicated above, because the rear surface elastic body is not provided in the vicinity of the two panel supporting sections 140.

Figure 16:
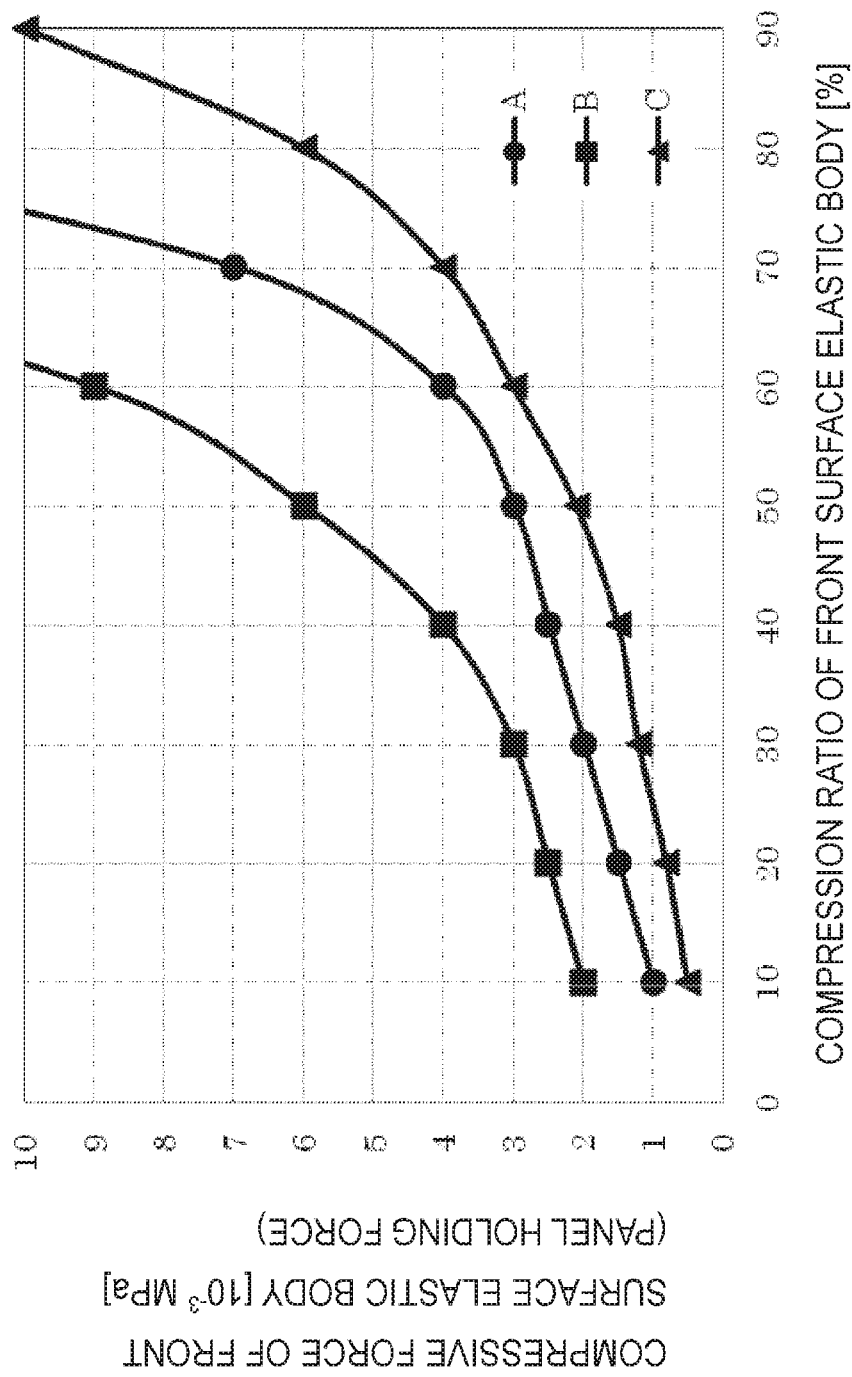
FIG. 16 shows a relationship between a compression ratio of a front surface elastic body, a compressive force of a front surface elastic body, and a pressing force on the display panel.

FIG. 16 shows one example of a relationship between the compression ratio of the front surface elastic body and the compressive force of the front surface elastic body (the pressing force (holding force) acting on the display panel). The curves A, B, C respectively indicate the relationships between the compression ratio and the compressive force corresponding to various materials used for the elastic members.

Figure 17:
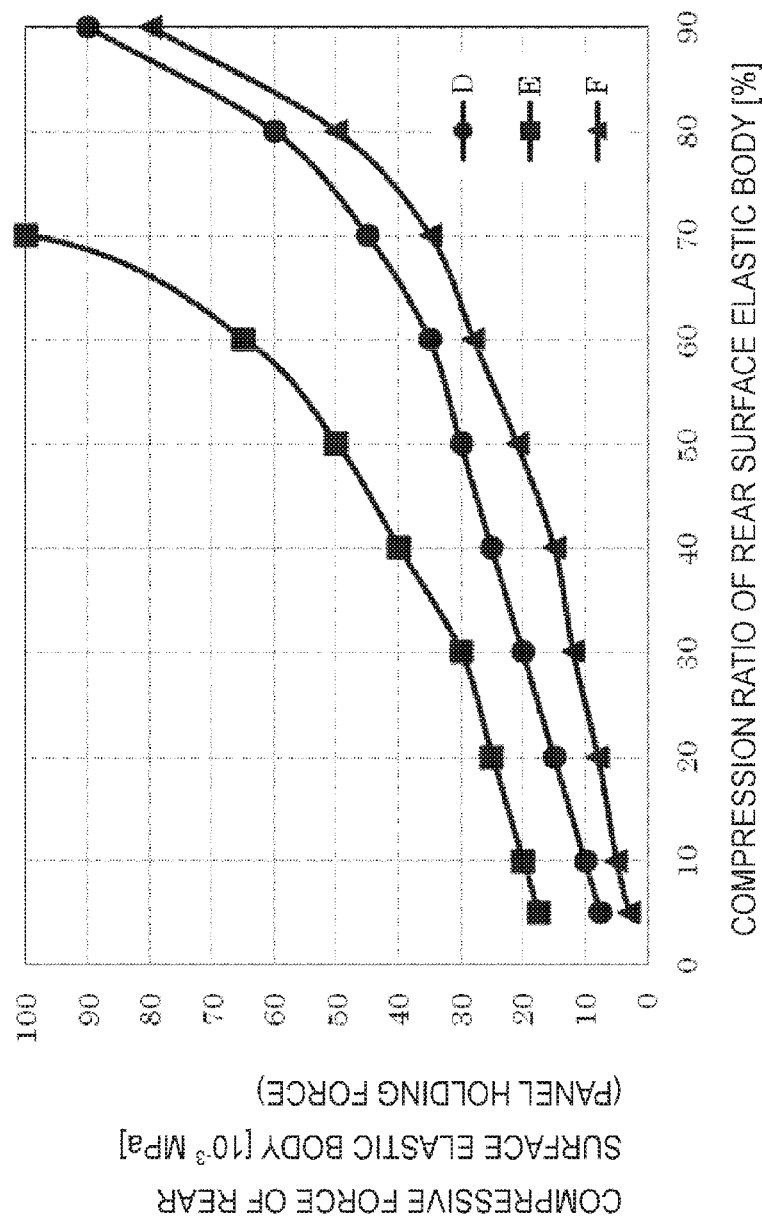
FIG. 17 shows a relationship between a compression ratio of a rear surface elastic body, a compressive force of a rear surface elastic body, and a pressing force on the display panel.

FIG. 17 shows one example of a relationship between the compression ratio of the rear surface elastic body and the compressive force of the rear surface elastic body (the pressing force (holding force) acting on the display panel). The curves D, E, F respectively indicate the relationships between the compression ratio and the compressive force corresponding to various materials used for the elastic members.

As shown in FIG. 16 and FIG. 17, the compressive stress P1 [MPa] determined from the compression ratio of the front surface elastic body and the compressive stress P2 [MPa] determined from the compression ratio of the rear surface elastic body vary depending on the material and thickness of the elastic members.

The compressive force (front surface) Fp and compressive force (rear surface) Fr are determined by the following formula.

$$Fp=P1 \times B1 \times L [N]$$

$$Fr=P2 \times B2 \times (L-2y) [N]$$

The length x [mm] of the panel supporting sections 140 is indicated by the following formula, when the length in the X direction from the panel supporting sections 140 to the lower-edge rear surface elastic body-end parts 110 and the lower-edge rear surface elastic body-central part 111 is taken to be a [mm].

$$y=x+2a [mm]$$

The force applied to the lower edge of the display panel 2 is converted into a force per unit length. When the frictional force per unit length is Fmt, the compressive force (front surface) per unit length is Fpt, and the frictional force (rear surface) per unit length is Frt, then these forces are expressed by the following formulas.

$$Fmt=Fm/2x [N]$$

$$Fpt=Fp/L [N]$$

$$Frt=Fr/(L-2y) [N]$$

Provided that the combination of the forces (Fmt+Fpt+Frt) is a uniform value at each position in the X direction of the display panel 2, excessive concentration of stress on the display panel 2 is suppressed in the event that warping or an external force is applied to the display panel 2.

A more concrete example of the configuration of the display device according to the first embodiment will now be described.

The panel holder 4 was formed by resin molding, using PC (polycarbonate) as a material and also mixing in 10% of glass filler. The material of the frame 3 was SECC (electro-galvanized steel sheet) formed by press die molding and having a thickness of 1 mm. The clearance between the frame 3 and the display panel 2 (the interval in the direction perpendicular to the display surface of the display panel 2) was 2.1 mm. A flexible foam cushion material was used for the front surface elastic bodies, and the front surface elastic bodies of each edge were formed to a thickness of 3 mm and a width of B1=3 mm. The front surface elastic bodies were fixed to the frame 3 by bonding using double-sided tape. Accordingly, the compression ratio of the front surface elastic bodies was 30%. A rubber cushion was used for the rear surface elastic bodies, and the cushion was fixed by bonding to the four edges of the panel holder 4 by double-sided tape.

The clearance between the panel holder 4 and the display panel 2 was 2.7 mm, the thickness was 3 mm, and the width was B2=3 mm. Accordingly, the compression ratio of the rear surface elastic bodies was 10%. Furthermore, the panel supporting sections 140 were disposed at two positions on the lower edge of the display panel 2, the length thereof in each position being set to x=30 mm. The lower-edge length of the panel was L=500 mm. As stated above, the rear surface elastic body was not disposed in the vicinity of the panel supporting sections 140. The length of the lower-edge rear surface elastic body-central part 111 was 300 mm, the length of the lower-edge rear surface elastic body-end parts 110 was 50 mm, and the separation length between lower-edge rear surface elastic body-end parts 110 and the lower-edge rear surface elastic body-central part 111 was a=10 mm each on both the left and right-hand sides of the panel supporting sections 140, and hence y=50 mm. The physical properties and shapes of the front surface elastic bodies and the rear surface elastic bodies, and the length of the panel supporting sections 140 along the lower edge of the display panel 2, are set on the basis of the characteristics of the warping which occurs in the display panel 2 due to change in the usage environment of the display device.

If the weight of the display panel 2 is 0.6 kg, then the vertical resistance force is N=5.88 N. If the coefficient of friction of the frictional force applied to the display panel 2 and the panel supporting sections 140 is µ=0.3, then the frictional force is approximately Fm=1.764 N.

If the material of the front surface elastic bodies is material A shown in FIG. 16, then since the compression ratio of the front surface elastic bodies is 30%, the compressive stress is P1=0.002 MPa. If the material of the rear surface elastic bodies is material D shown in FIG. 17, then since the compression ratio of the rear surface elastic bodies is 10%, the compressive stress is P2=0.01 MPa. Consequently, the compressive force (front surface) is about Fp=3 N, and the compressive force (rear surface) is about Fr=12 N.

Accordingly, when converted into a force per unit length, the frictional force per unit length was approximately Fmt=0.0294 [N/mm], the compressive force per unit length (front surface) was approximately Fpt=0.006 [N/mm], and the compressive force per unit length (rear surface) was approximately Frt=0.03 [N/mm]. The only regions where Fmt acts are the segments where the supporting sections are disposed, and the only regions where Frt acts are the segments where the rear surface elastic bodies are disposed.

Figure 14:
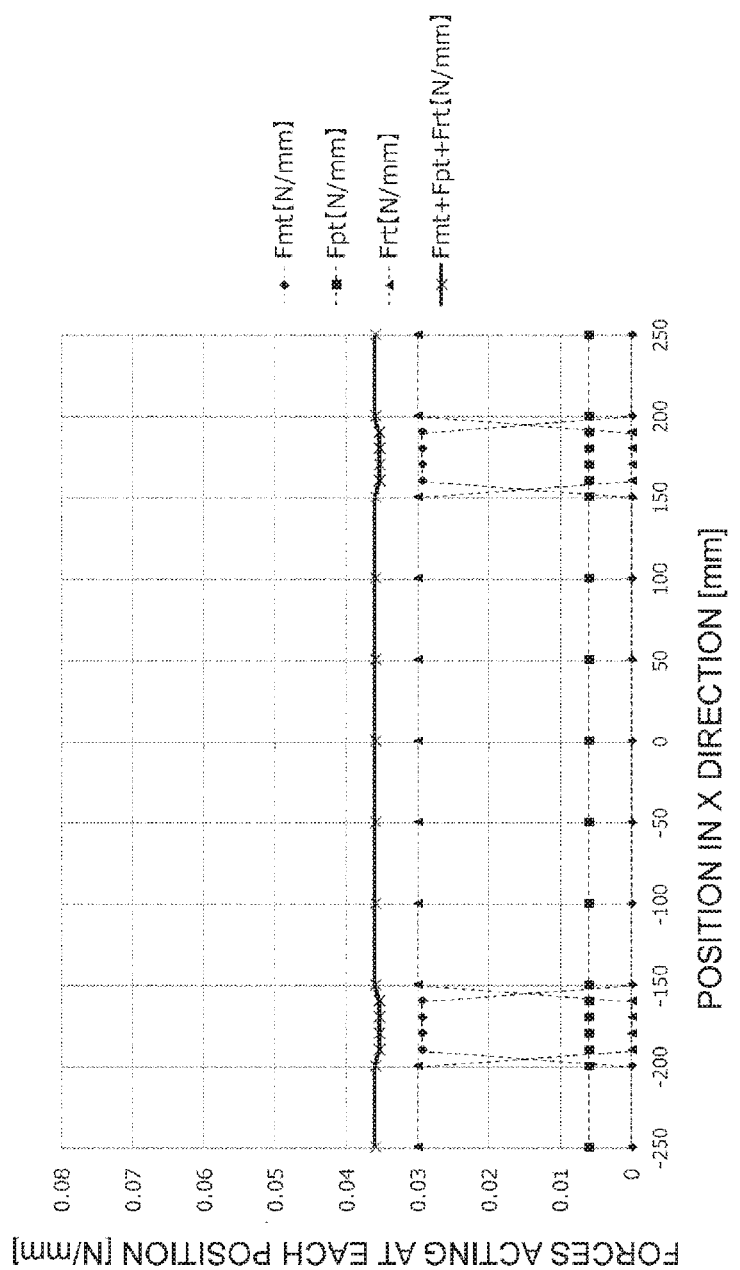
FIG. 14 shows a relationship indicating a force applied to a lower edge portion of the display panel according to the first embodiment.
Figure 15:
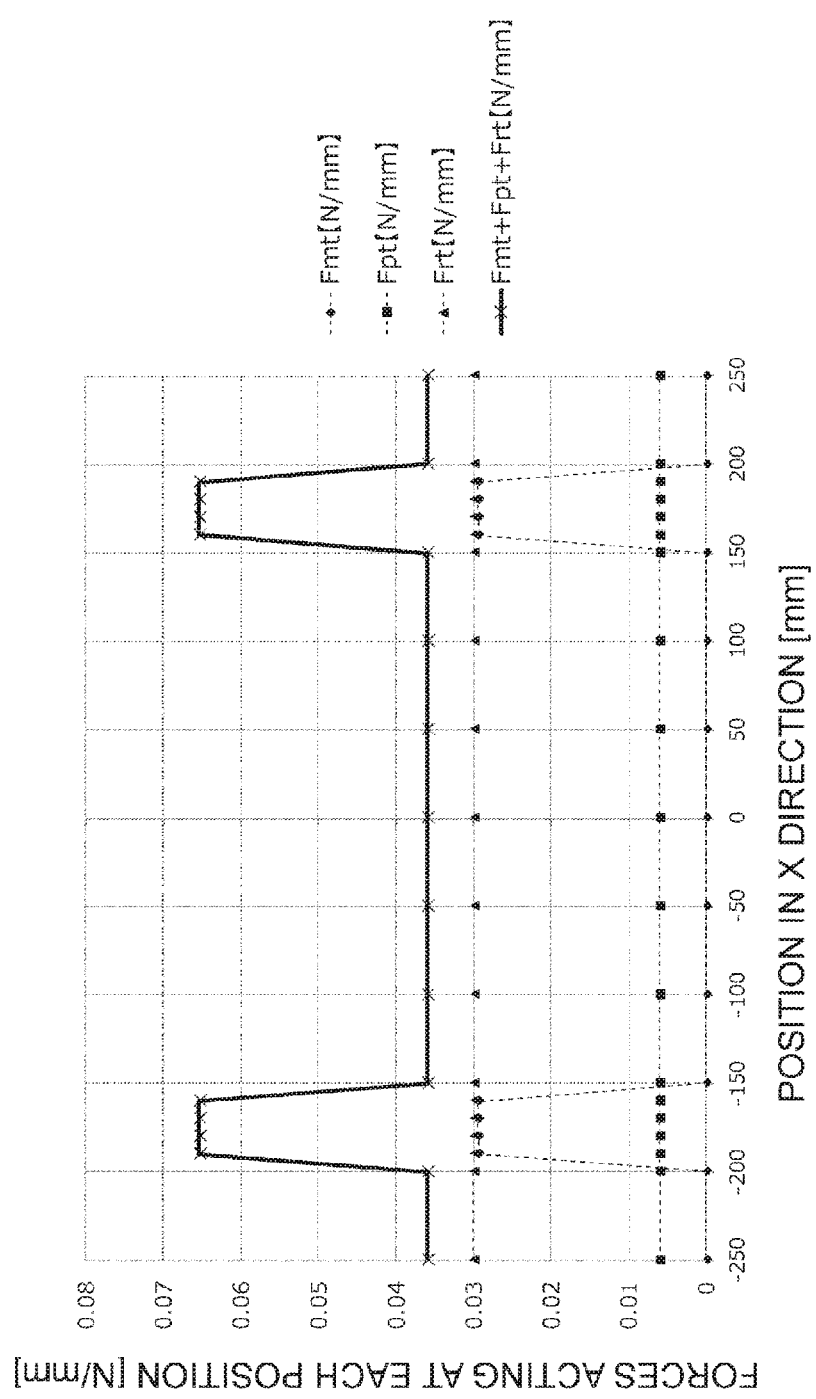
FIG. 15 shows a relationship indicating a force applied to a lower edge portion of a prior art display panel.

FIG. 14 is a diagram showing forces acting at respective positions of the lower edge of the display panel 2 according to the first embodiment, under the conditions described above. FIG. 15 is a diagram showing one example of the forces acting at each position of the lower edge of a conventional display panel. As shown in FIG. 14, the distribution of the forces (Fmt+Fpt+Frt) acting at the respective positions on the lower edge of the display panel 2 is substantially equal in the X direction. On the other hand, as shown in FIG. 15, in a conventional display panel, when the rear surface elastic bodies are situated also in the vicinity of the panel supporting sections, then the force acting on the display panel in the vicinity of the panel supporting sections becomes large, and the distribution of force may become unequal. In the first embodiment, by selecting appropriate values for parameters such as B1, L, P1, P2, etc., it is possible to make the force acting on the display panel more even.

By adopting the configuration according to the first embodiment, even if warping occurs or an external force is applied to the display panel of the display device, since no elastic force acts from the rear surface elastic bodies in the vicinity of the panel supporting sections, then the stress occurring in the display panel is alleviated and display non-uniformities can be reduced. The configuration according to the first embodiment is suitable in particular for application to cases where the display panel moves in the rear surface direction or warping occurs.

Second Embodiment

A second embodiment is described now on the basis of the drawings. In the second embodiment, the configuration of the rear surface elastic bodies differs from the first embodiment. The points of difference with respect the first embodiment are described in detail below.

Figure 5:
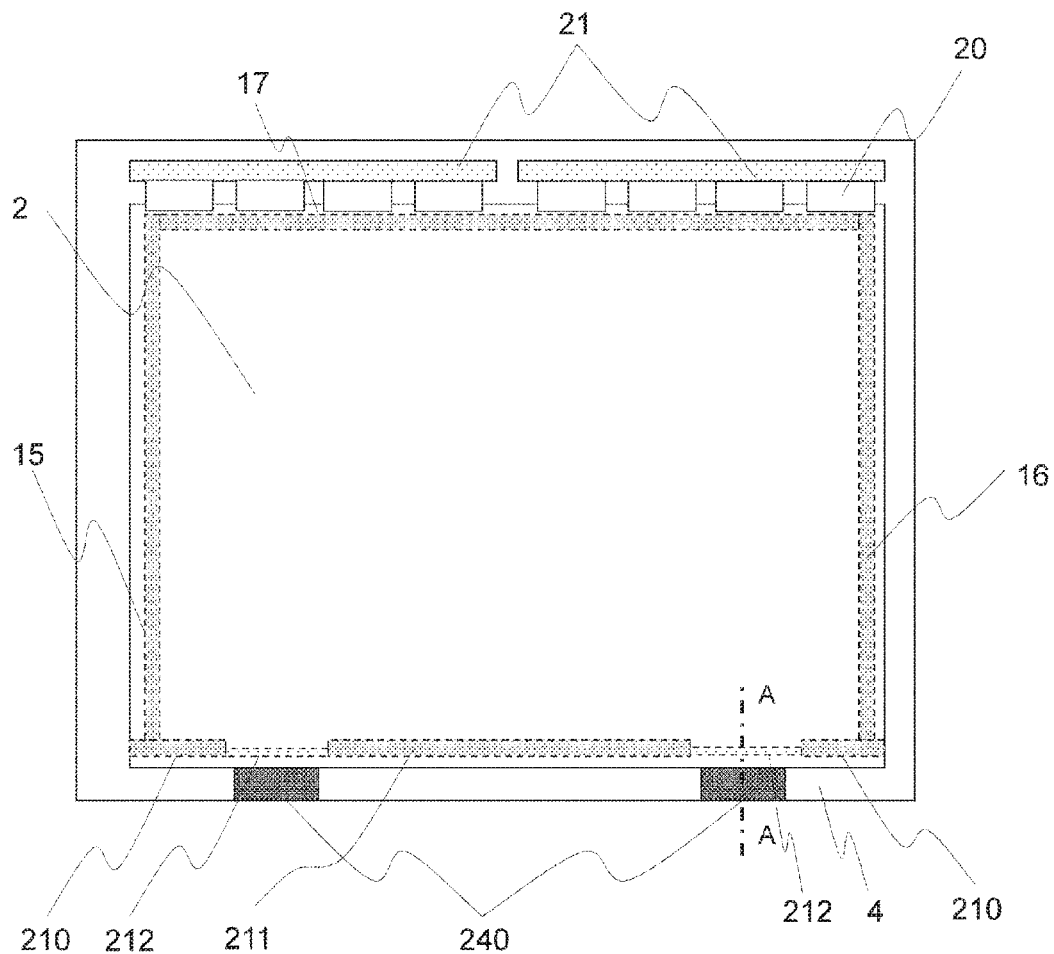
FIG. 5 is front surface diagram showing a schematic view of the display device according a second embodiment.
Figure 6:
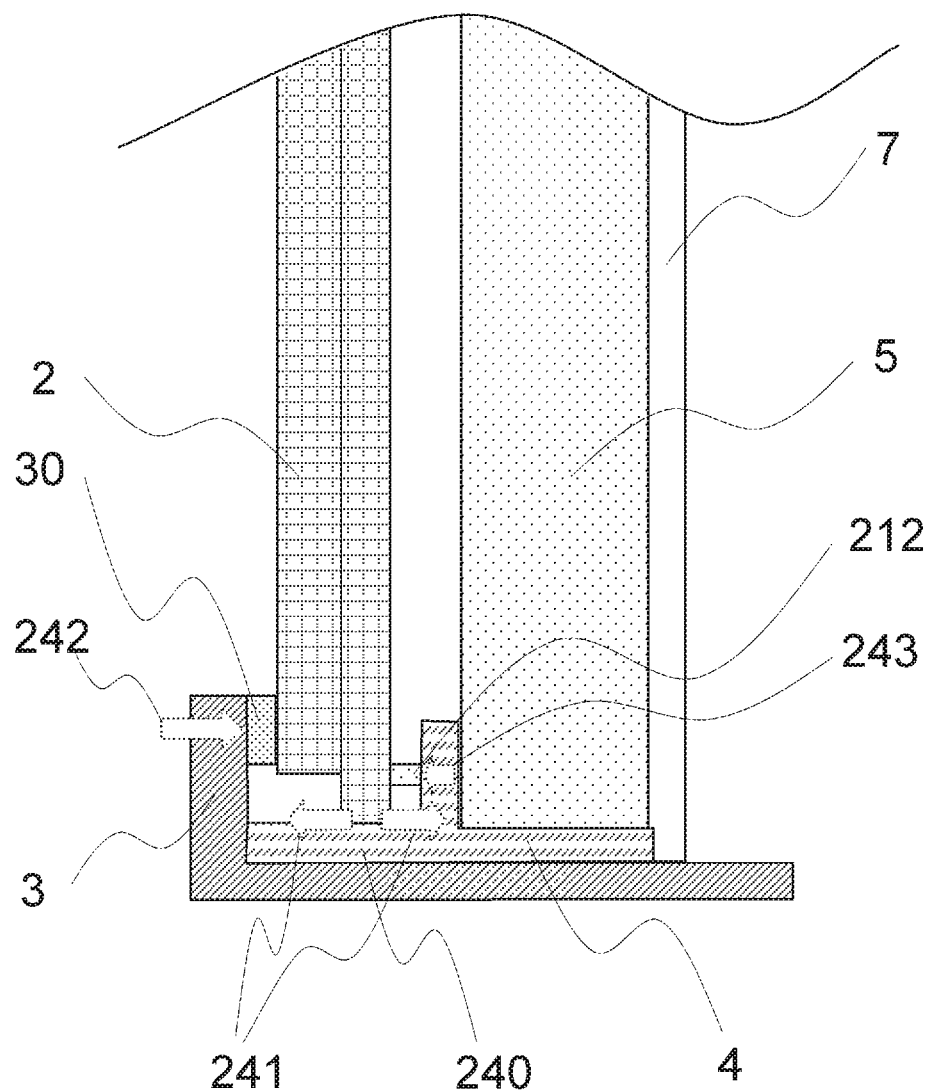
FIG. 6 is a cross-sectional diagram along A-A in FIG. 5, which shows a schematic view of the display device according to the second embodiment.

FIG. 5 is front surface diagram showing a schematic view of the display device according to the second embodiment. FIG. 6 is a cross-sectional diagram along A-A in FIG. 5, which shows a schematic view of the display device according to the second embodiment.

As shown in FIG. 5 and FIG. 6, the second embodiment adopts a structure in which the volume of the rear surface elastic body is reduced in the vicinity of the panel supporting sections 240. In order to reduce the volume, the lower-edge rear surface elastic body has lower-edge rear surface elastic body-end parts 210 which are disposed at both ends, a lower-edge rear surface elastic body-central part 211 which is disposed in the center, and lower-edge rear surface elastic body-supporting parts 212 which are disposed in the vicinity of the panel supporting sections 240 and between the end parts 210 and the central part 211. The lower-edge rear surface elastic body-supporting parts 212 have a smaller width (smaller size in the breadthways direction of the rear surface elastic body parallel to the panel display surface), than the lower-edge rear surface elastic body-end parts 210 and the lower-edge rear surface elastic body-central part 211. Therefore, the surface area of contact with the rear surface elastic bodies is reduced in the plane parallel to the planar direction of the display panel 2, and the volume of the rear surface elastic body is also reduced. The desirable set value for the width of the lower-edge rear surface elastic body-supporting parts 212 varies depending on the relationship between the frictional force 241, the front surface holding force 242, the rear surface holding force 243 and the stress occurring in the display panel 2, etc. For instance, the width of the lower-edge rear surface elastic body-supporting parts 212 is desirably approximately ½ to ¹/₁₀ of the width of the lower-edge rear surface elastic body-central part 211.

Furthermore, the length of the lower-edge rear surface elastic body-supporting parts 212 depends on the length of the panel supporting sections 240, but is desirably the length of the panel supporting sections 240 plus 0 to 100 mm. For example, if the length of the panel supporting sections 240 is 30 mm, then the length of the lower-edge rear surface elastic body-supporting parts 212 should be set to 50 mm by adding 10 mm respectively on the left and right-hand sides of the length to the length of the panel supporting sections 240. Furthermore, if the width of the other rear surface elastic bodies is 3 mm, then the width of the lower-edge rear surface elastic body-supporting parts 212 should be set to 1 mm, for example.

Moreover, as a method for making the volume of the lower-edge rear surface elastic body-supporting parts 212 smaller than that of other portions, it is effective to make the thickness of the lower-edge rear surface elastic body-supporting parts 212 smaller than the thickness of the lower-edge rear surface elastic body-end parts 210 and the lower-edge, rear surface elastic body-central part 211. By reducing the thickness, the compression ratio of the elastic body is reduced. The compression ratio of the lower-edge rear surface elastic body-supporting parts 212 is desirably ½ to ¹/₁₀ approximately of that of other portions. By this means, the rear surface holding force 243 is reduced in the vicinity of the panel supporting sections 240, and therefore excessive concentration of stress at the panel supporting sections is suppressed, and local deformation of the display panel 2 is not liable to occur.

According to the configuration of the second embodiment, even with a configuration in which rear surface elastic bodies are disposed in the vicinity of the panel supporting sections, since the rear surface holding force acting on the display panel is reduced when the display panel warps or an external force acts thereon, then the stress occurring in the display panel is alleviated and display non-uniformities can be reduced.

Third Embodiment

Next, a third embodiment is described on the basis of the drawings. In the third embodiment, the configuration of the rear surface elastic bodies differs from the first embodiment and the second embodiment.

Figure 7:
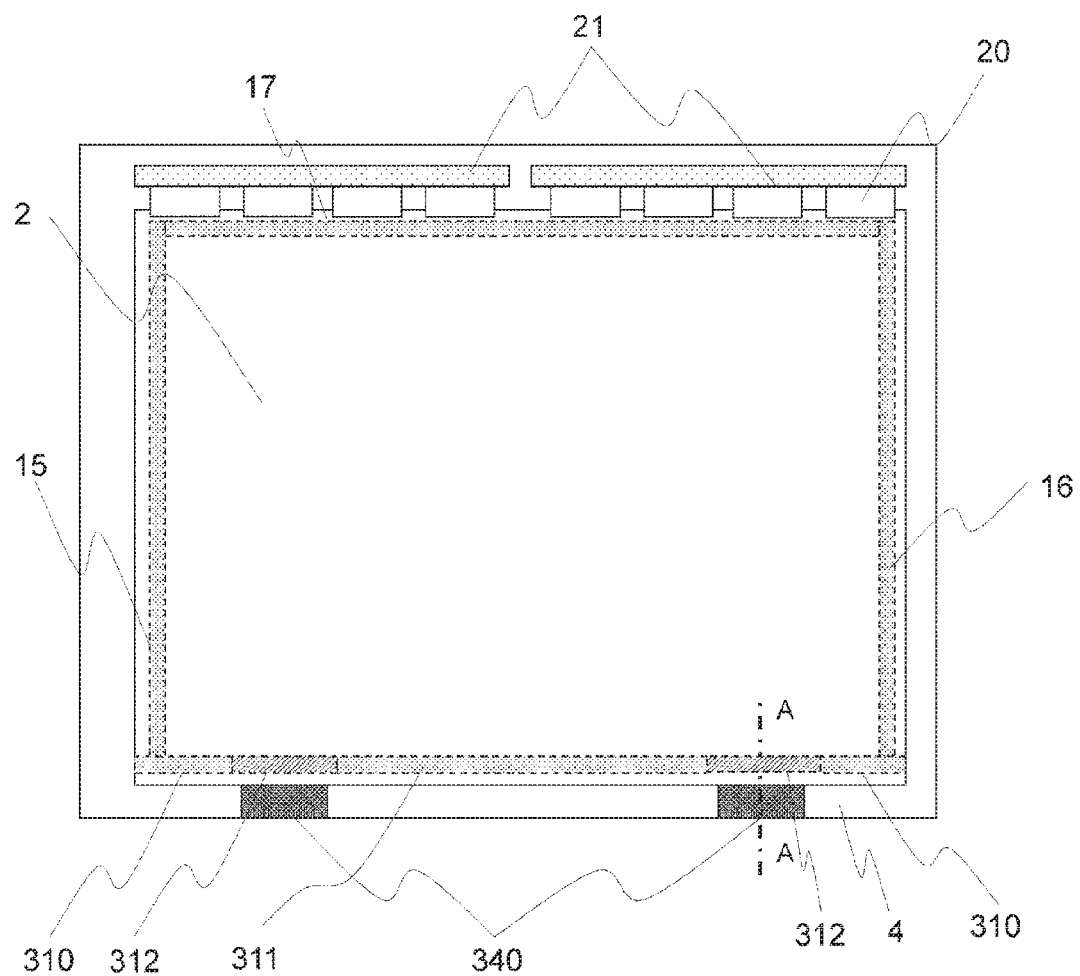
FIG. 7 is front surface diagram showing a schematic view of the display device according to a third embodiment.

FIG. 7 is front surface diagram showing a schematic view of the display device according to the third embodiment.

As shown in FIG. 7, the third embodiment adopts a structure in which the material of the rear surface elastic bodies is varied in the vicinity of the panel supporting sections 340. In particular, the elastic ratio and hardness of the rear surface elastic bodies are changed in the vicinity of the panel supporting sections 340, compared to other portions. Similarly to the second embodiment, the lower-edge rear surface elastic body has lower-edge rear surface elastic body-end parts 310 which are disposed at both ends, a lower-edge rear surface elastic body-central part 311 which is disposed in the center, and lower-edge rear surface elastic body-supporting parts 312 which are disposed in the vicinity of the panel supporting sections 340 and between the end parts 310 and the central part 311. The material of the lower-edge rear surface elastic body-end parts 310 and the lower-edge rear surface elastic body-central part 311 is the same, but the material of the lower-edge rear surface elastic body-supporting parts 312 is different. For instance, the elastic ratio of the lower-edge rear surface elastic body supporting parts 312 is desirably approximately ½ to ¹⁄₁₀ that of the lower-edge rear surface elastic body-central part 311. Therefore, the elastic force acting on the display panel 2 from the rear surface elastic body is reduced in the vicinity of the panel supporting sections 340. Consequently, even if warping occurs or an external force is applied to the display panel 2, excessive concentration of stress in the panel supporting sections is suppressed, and local deformation of the display panel 2 is not liable to occur.

According to the configuration of the third embodiment, even with a configuration in which rear surface elastic bodies are disposed in the vicinity of the panel supporting sections, since the rear surface holding force acting on the display panel is reduced when the display panel warps, or an external force acts thereon, then the stress occurring in the display panel is alleviated, and display non-uniformities can be reduced.

Fourth Embodiment

Next, a fourth embodiment is described on the basis of the drawings. In the fourth embodiment, the configuration of the rear surface elastic bodies differs from the first embodiment.

Figure 8:
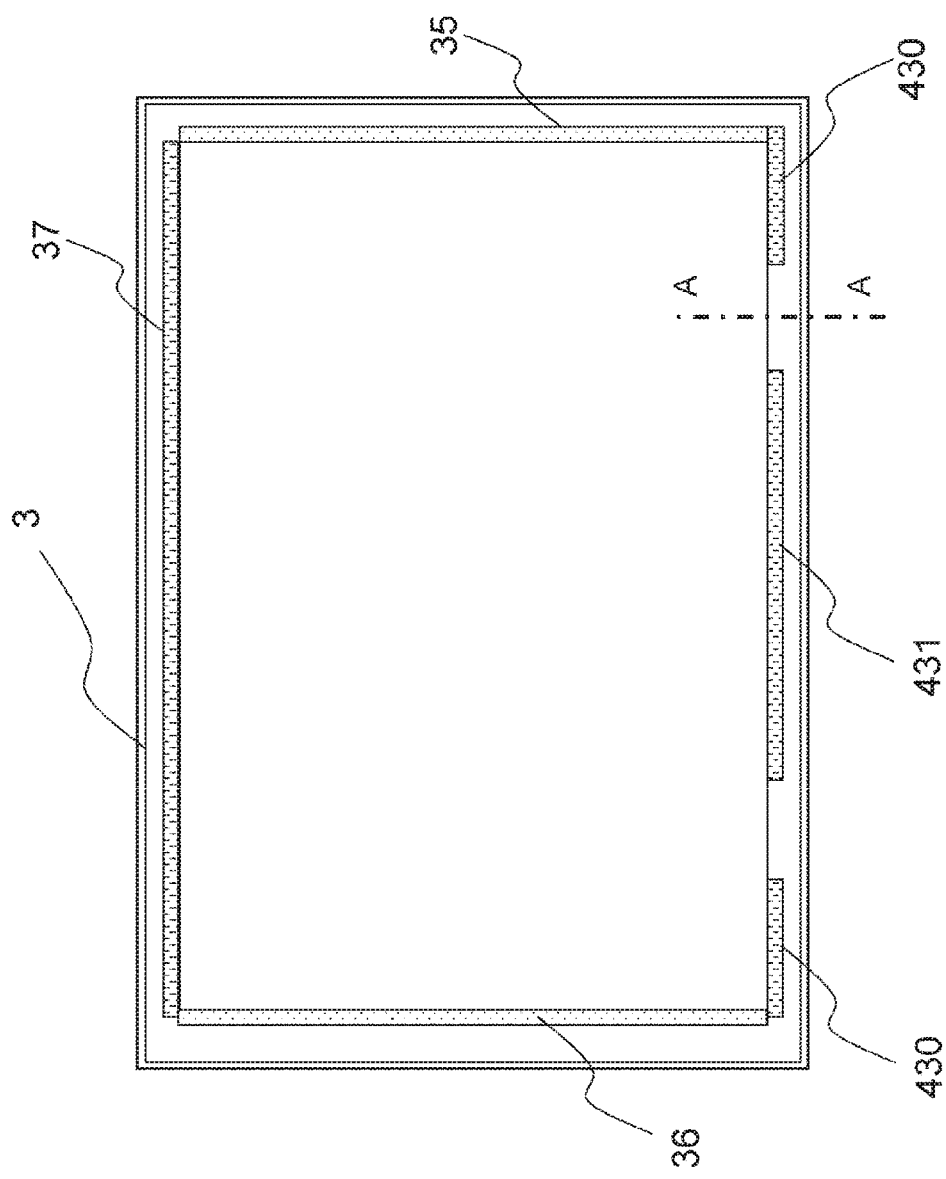
FIG. 8 is a diagram showing an arrangement structure of front surface elastic bodies of a frame in a display device according to a fourth embodiment.
Figure 9:
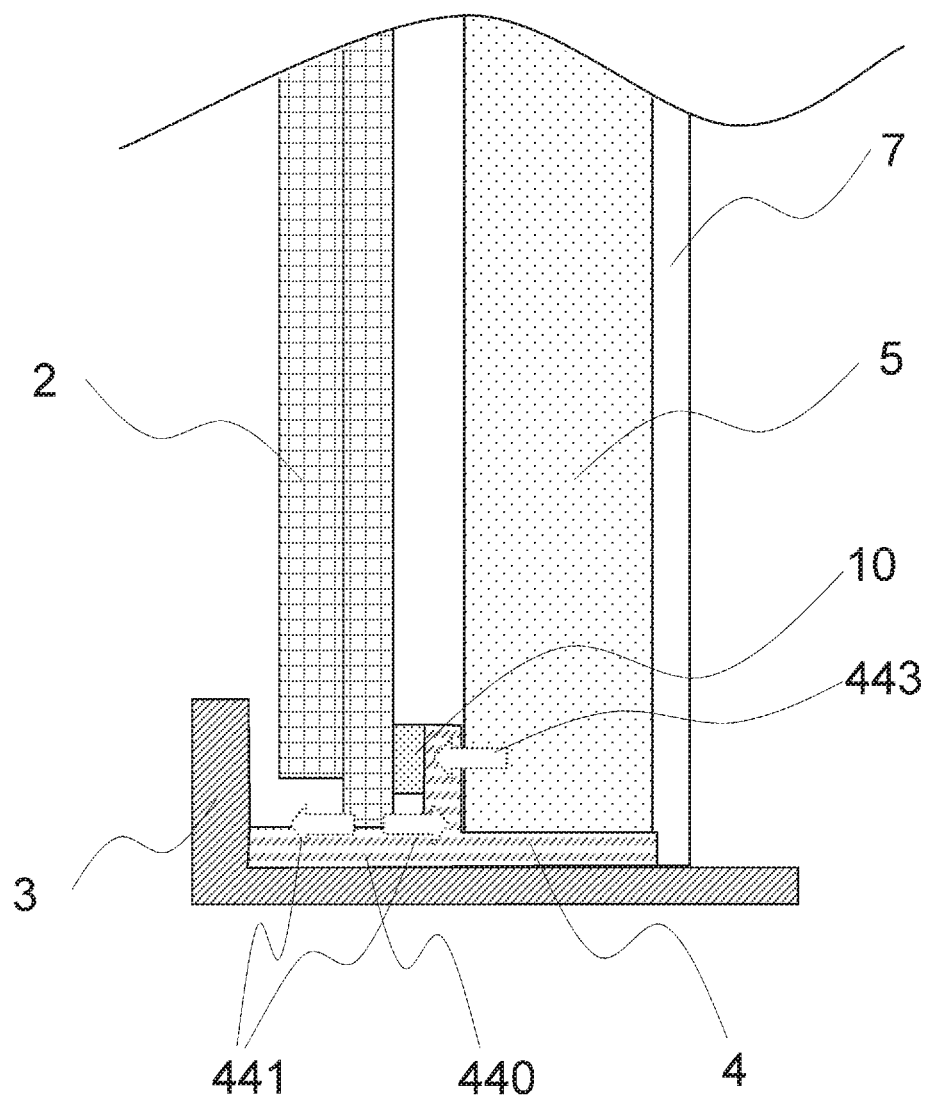
FIG. 9 is a cross-sectional diagram along A-A in FIG. 8, which shows a schematic view of the display device according to the fourth embodiment.

FIG. 8 is a diagram showing an arrangement structure of the front surface elastic bodies of a frame in a display device according to the fourth embodiment. FIG. 9 is a cross-sectional diagram along A-A in FIG. 8, which shows a schematic view of the display device according to the fourth embodiment. FIG. 8 is a diagram viewed from the rear surface side of the frame.

As shown in FIG. 8 and FIG. 9, the fourth embodiment adopts a structure in which the front surface elastic body is not arranged in the vicinity of the panel supporting sections 440. The front surface elastic bodies fixed to the frame 3 include a left-edge front surface elastic body 35, a right-edge front surface elastic body 36, and an upper-edge front surface elastic body 37. The lower-edge front surface elastic body is constituted by lower-edge front surface elastic body-end parts 430 which are disposed at both ends, and a lower-edge front surface elastic body central part 431 which is disposed in the center, these parts being arranged in mutually separated fashion. The separation length between the lower-edge front surface elastic body-end parts 430 and the lower-edge front surface elastic body-central part 431 depends on the length of the panel supporting sections 440. The separation length between the lower-edge front surface elastic body-end parts 430 and the lower-edge front surface elastic body-central part 431 is desirably, for example, the length of the panel supporting sections 440 plus 0 to 100 mm. If warping occurs or an external force is applied to the display panel, then although a frictional force 441 and a rear surface holding force 443 act in the vicinity of the panel supporting sections 440, an elastic force due to the front surface elastic body does not act from the front surface side. By adopting a configuration wherein an elastic force due to the front surface elastic body is not generated in the vicinity of the panel supporting sections 440 in this way, excessive concentration of stress in the panel supporting sections is suppressed, and local deformation of the display panel also becomes less liable to occur.

According to the configuration of the fourth embodiment, even in cases where the display panel warps or an external force is applied thereto, no elastic force due to the front surface elastic body acts in the vicinity of the panel supporting sections, and the stress occurring in the display panel is alleviated. Therefore, display non-uniformities can be reduced. The configuration according to the fourth embodiment is suitable in particular for application to cases where the display panel moves in the front surface direction or warping occurs.

Fifth Embodiment

Next, a fifth embodiment is described on the basis of the drawings.

Figure 10:
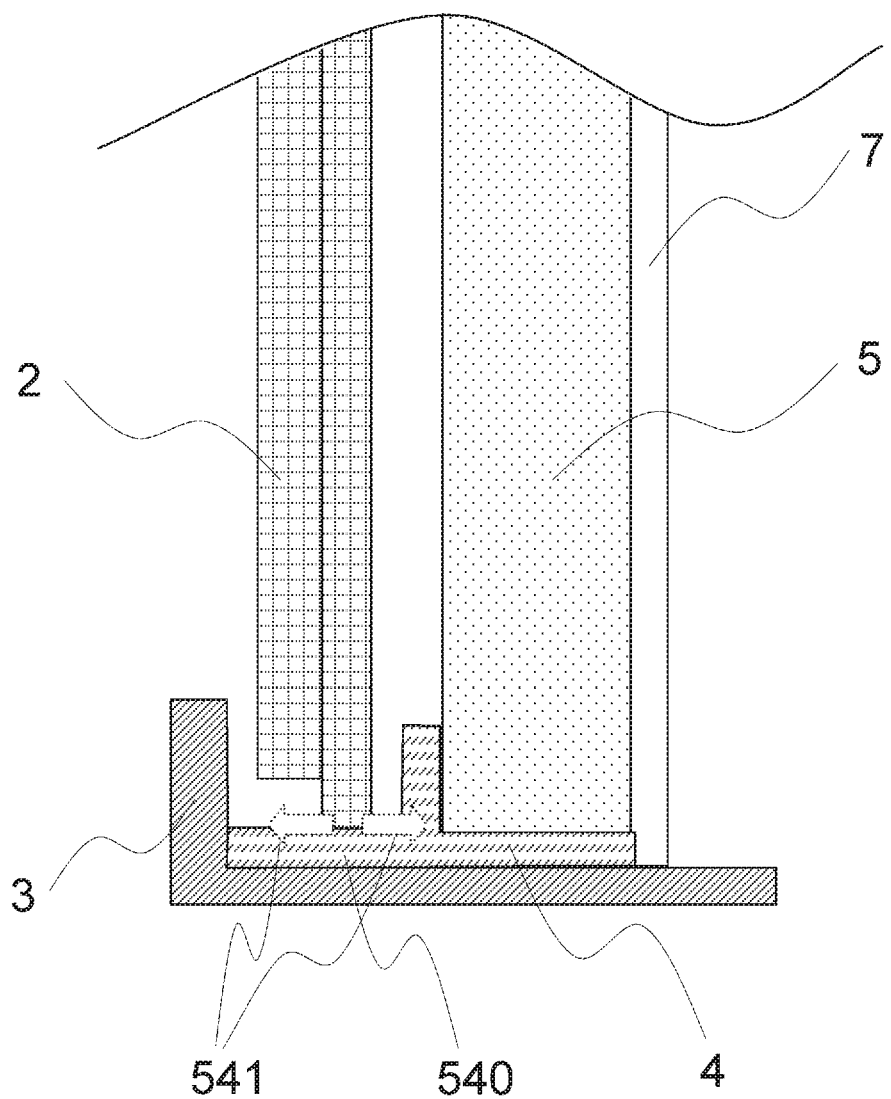
FIG. 10 is a cross-sectional diagram similar to cross-section A-A in FIG. 2, which shows a schematic view of the display device according to a fifth embodiment.
Figure 11:
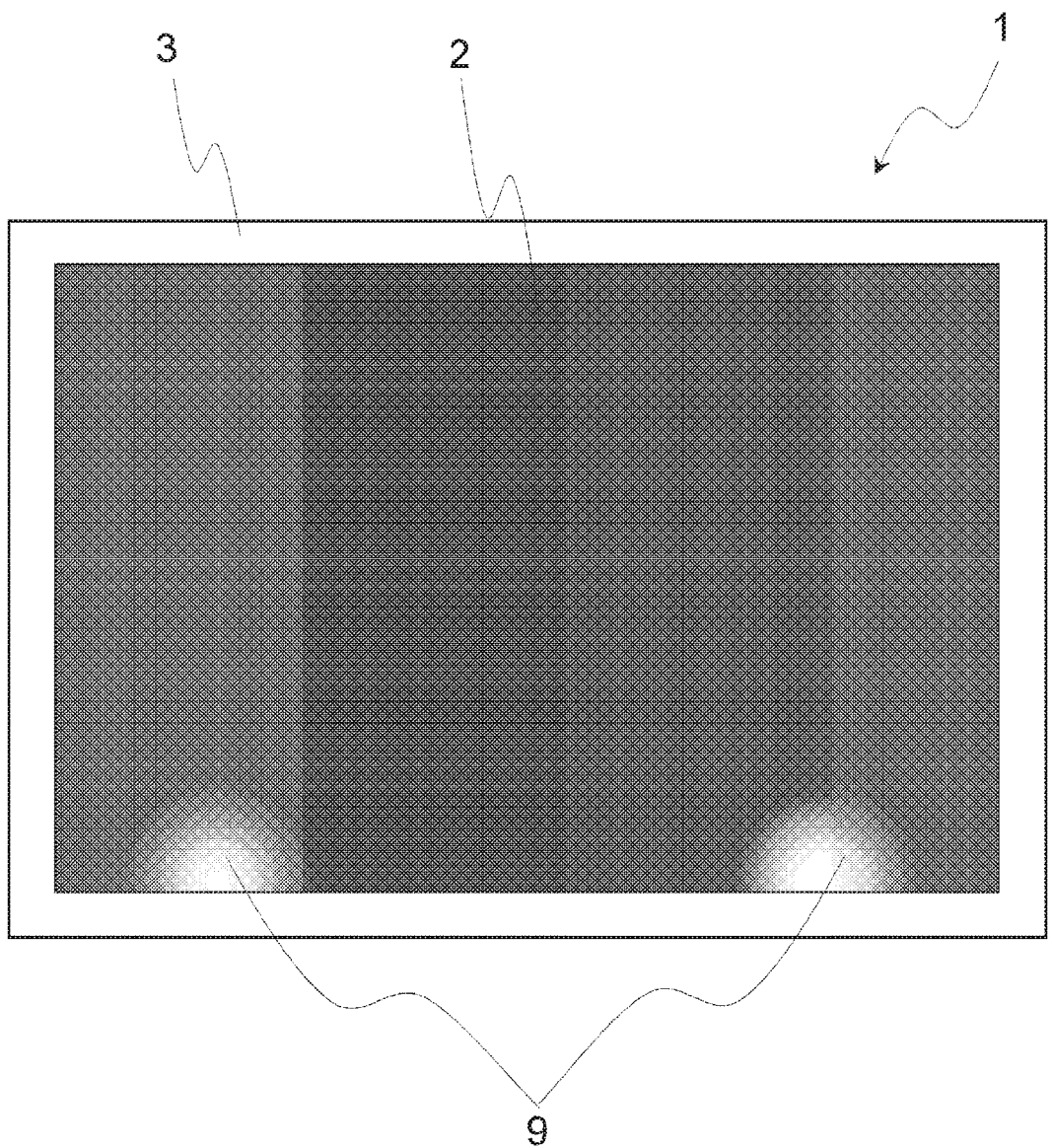
FIG. 11 is a front surface diagram showing one example of a state where display non-uniformities have occurred in a prior art display device.
Figure 12:
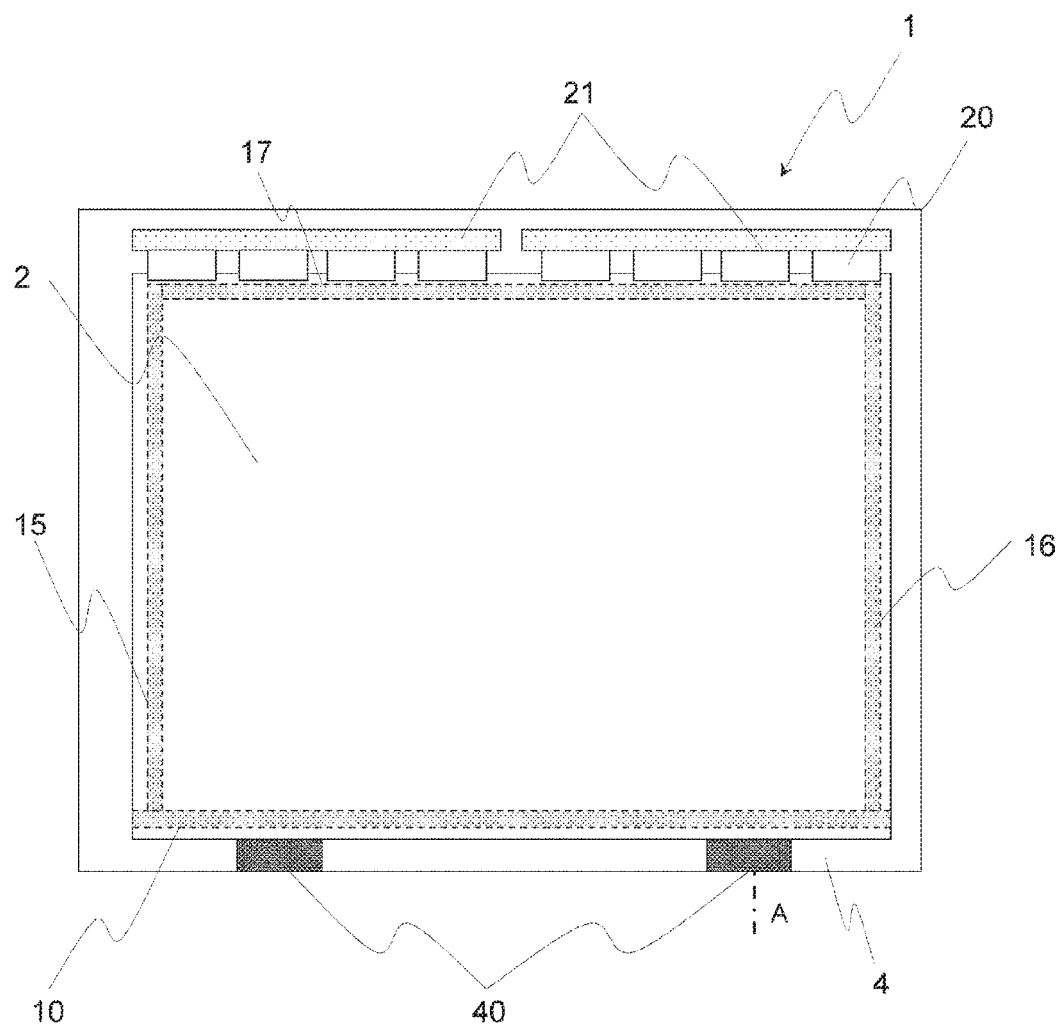
FIG. 12 is front surface diagram showing a schematic view of a prior art display device.
Figure 13:
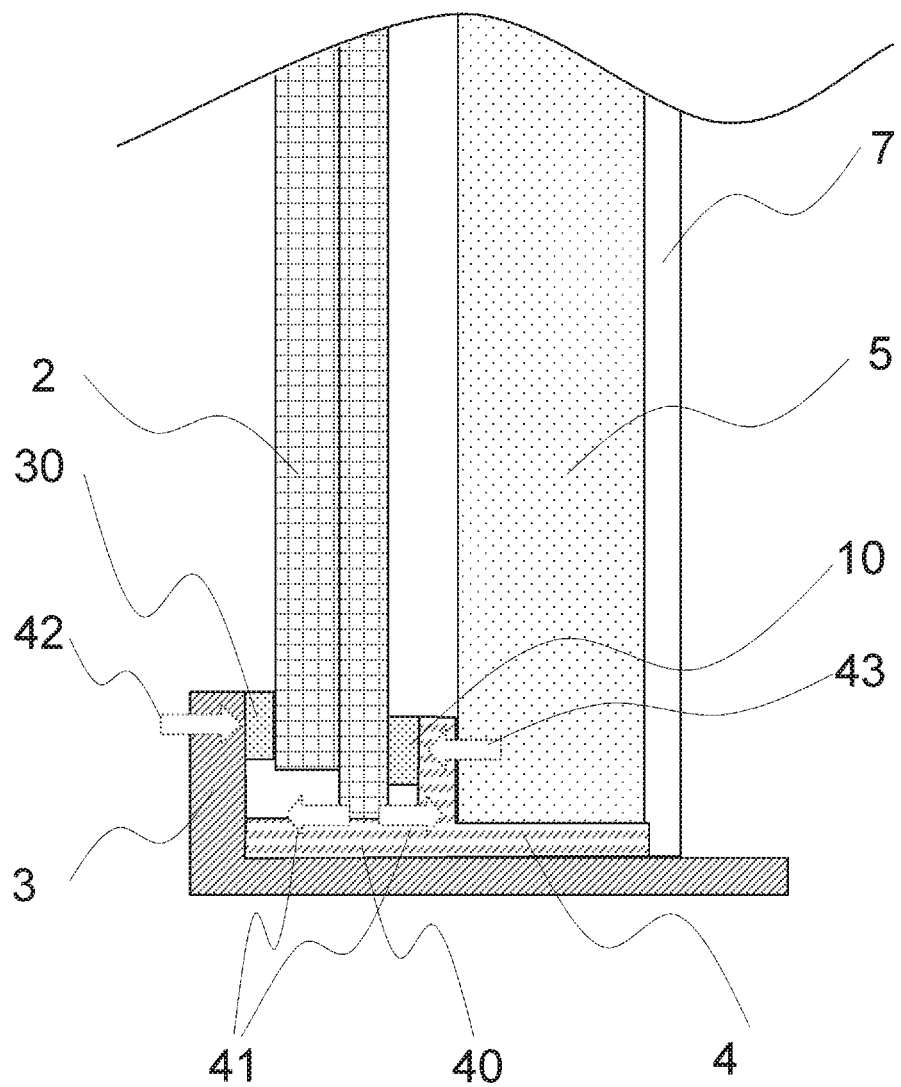
FIG. 13 is a cross-sectional diagram along A-A in FIG. 12, which shows a schematic view of a prior art display device.

FIG. 10 is a cross-sectional drawing showing a schematic view of a display device according to the fifth embodiment. The position of the cross-section is a position where a panel supporting section 540 is located, similarly to the cross-section A-A in FIG. 2.

As shown in FIG. 10, in the fifth embodiment, a structure is adopted in both the front surface elastic body and the rear surface elastic body are not arranged in the vicinity of the panel supporting sections 540. Consequently, only a frictional force 541 arises when warping occurs or an external force is applied to the display panel 2, and an elastic force due to the elastic body is not applied from the rear surface side and the front surface side of the display panel 2. Therefore, even in cases where the display panel warps or an external force is applied thereto, excessive concentration of stress in the display panel 2 in the vicinity of the panel supporting sections is suppressed, and local deformation of the display panel 2 al so becomes less liable to occur. Furthermore, the front surface elastic body and the rear surface elastic body are disposed in the locations apart from the vicinity of the panel supporting sections 540, and therefore a front surface holding force and a rear surface holding force act on the display panel 2 and the display panel 2 is held at an appropriate position.

By adopting the configuration according to the fifth embodiment, even if warping occurs or an external force is applied to the display panel of the display device, since an elastic force is not applied from both the front surface side and the rear surface side in the vicinity of the panel supporting sections, then the stress occurring in the display panel is alleviated and display non-uniformities can be reduced. The configuration according to the fifth embodiment is suitable for application to cases where movement or warping of the display panel may occur on both the front surface side and the rear surface side.

Sixth Embodiment

Next, a sixth embodiment is described on the basis of the drawings.

Figure 18:
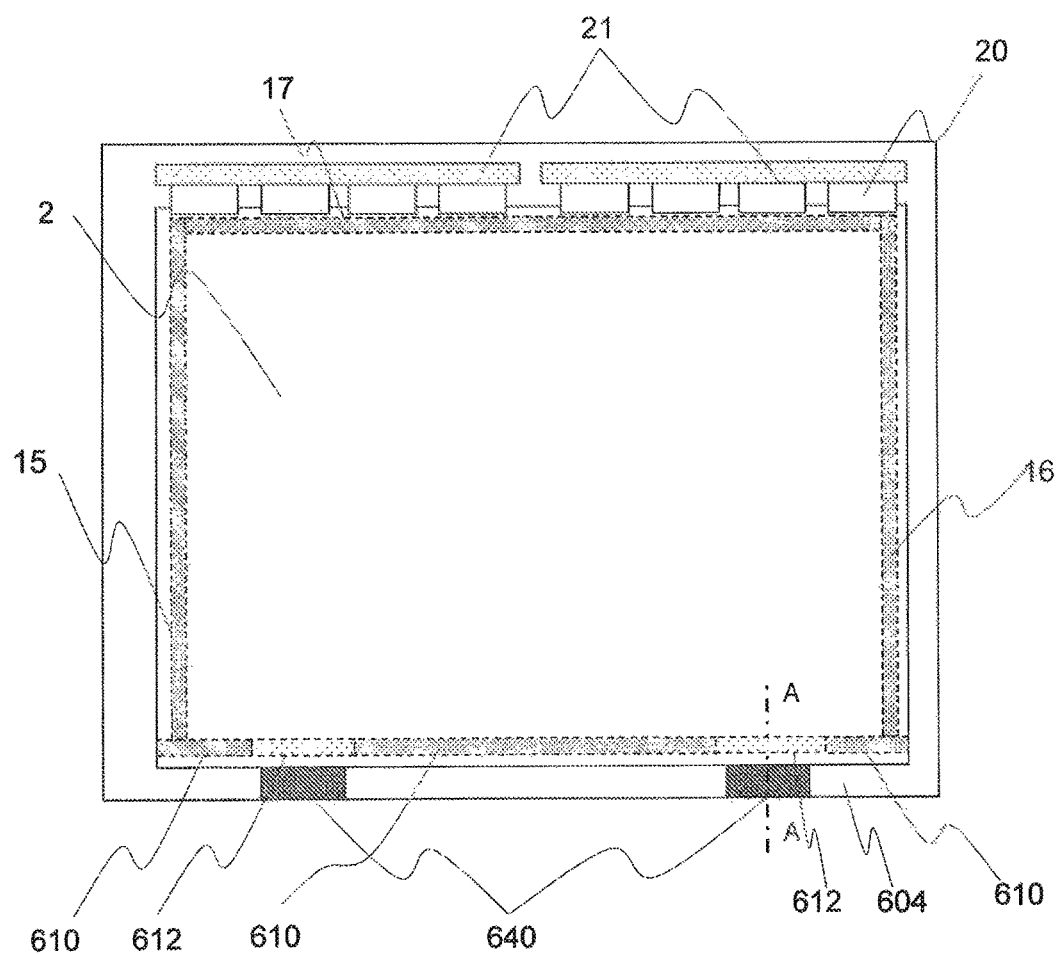
FIG. 18 is a front surface diagram showing a schematic view of the display device according to a sixth embodiment.
Figure 19:
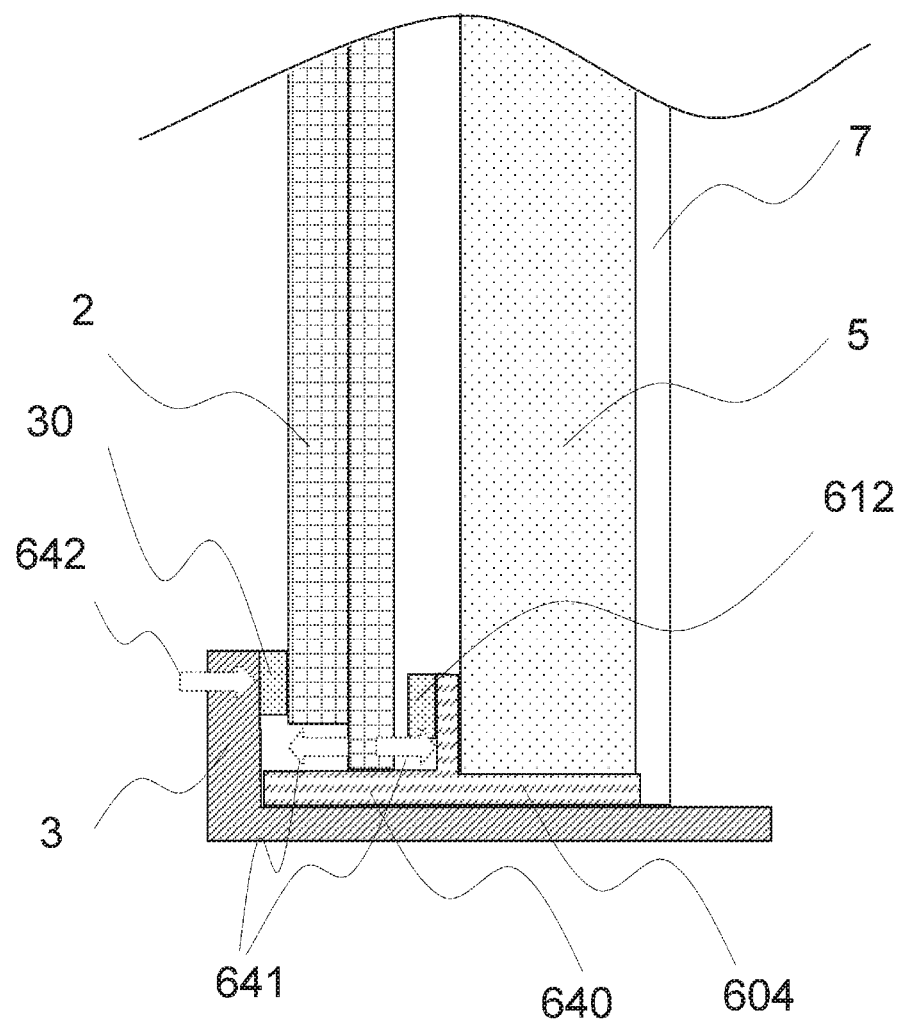
FIG. 19 is a cross-sectional diagram along A-A in FIG. 18, which shows a schematic view of the display device according to the sixth embodiment.

FIG. 18 is front surface diagram showing a schematic view of the display device according to the sixth embodiment. FIG. 19 is a cross-sectional diagram along A-A in FIG. 18, which shows a schematic view of the display device according to the sixth embodiment.

As shown in FIG. 18 and FIG. 19, in the sixth embodiment, the rear surface elastic bodies 610 and 612 are formed continuously. On the other hand, at the positions in the vicinity of the panel supporting sections 640, a portion of the panel holder 604 is formed so as to have a longer distance from the display panel 2, than in other positions. Consequently, in these segments, contact of the rear surface elastic body 612 against the display panel 2 is suppressed, and therefore a holding force due to the rear surface elastic body is prevented from acting on the display panel 2 and only a front surface holding force 642 and a frictional force 641 act on the display panel 2. The distance between the panel holder 604 and the display panel 4 in this segment is a distance which prevents contact of the rear surface elastic body 612 against the display panel 4. More specifically, the distance is desirably set to approximately 1 to 5 mm, although the value thereof depends on the thickness of the rear surface elastic body 612. In the locations apart from the vicinity of the panel supporting sections 640, since the front surface elastic body and the rear surface elastic body are disposed so as to contact the display panel 2, then a front surface holding force and a rear surface holding force both act on the display panel 2, and the display panel 2 is held at an appropriate position.

In the configuration according to the sixth embodiment, it is possible to form the rear surface elastic body without separations, and furthermore, since the panel holder can be manufactured as an integrated molding, then increase in the assembly work and number of components can be suppressed. Furthermore, a similar beneficial effect to that of the other embodiments is achieved in that, even in cases where warping occurs or an external force is applied to the display panel of the display device, the stress occurring in the display panel is alleviated and display uniformities can be reduced.

Above, according to the present invention, even if warping occurs or an external force is applied to the display panel of the display device, the forces acting on the display panel from the front surface elastic body and the rear surface elastic body are smaller in the vicinity of the panel supporting sections than in the other portions. Consequently, it is possible to suppress the occurrence of large stress in the display panel in the vicinity of the panel supporting sections, and display non-uniformities can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-010397, filed on Jan. 22, 2015, and Japanese Patent Application No. 2015-256526, filed on Dec. 28, 2015, which are hereby incorporated by reference herein in their entirety.

What is claimed is:

1. A display device, comprising:
   a display panel;
   a first holding member which holds a plurality of sides of the display panel from a front surface side;
   first shock-absorbing member which is disposed between the front surface side of the display panel and the first holding member, at least at a side of a lower end section of the display panel;
   a second holding member which holds the plurality of sides of the display panel from a rear surface side;
   a second shock-absorbing member which is disposed between the rear surface side of the display panel and the second holding member, at least at the side of the lower end section of the display panel; and
   a supporting member which supports a portion of the lower end section of the display panel;
   wherein a force against the display panel from the first shock-absorbing member and the second shock-absorbing member is smaller in a vicinity of the supporting member than in other portions.

2. The display device according to claim 1, wherein at least one of the first shock-absorbing member and the second shock-absorbing member is partially not arranged in the vicinity of the supporting member.

3. The display device according to claim 1, wherein a length of a segment in the vicinity of the supporting member in which the force against the display panel from the first shock-absorbing member and the second shock-absorbing member is smaller than in other portions is greater than a length of the supporting member.

4. The display device according to claim 1, wherein a thickness of at least one of the first shock-absorbing member and the second shock-absorbing member in a direction approximately perpendicular to the display surface of the display panel is smaller, partially, in the vicinity of the supporting member than in other portions.

5. The display device according to claim 1, wherein a thickness of at least one of the first shock-absorbing member and the second shock-absorbing member in a direction approximately parallel to the display surface of the display panel is smaller, partially, in the vicinity of the supporting member than in other portions.

6. The display device according to claim 1, wherein at least one of the first shock-absorbing member and the second shock-absorbing member is made using a material having a smaller hardness, partially, in the vicinity of the supporting member than in other portions.

7. The display device according to claim 1, wherein a distance between the second holding member and the display panel is greater, partially, in the vicinity of the supporting member, than at other positions, and the second shock-absorbing member and the display panel do not make contact in the vicinity of the supporting member.

8. The display device according to claim 1, wherein at least one of the first shock-absorbing member and the second shock-absorbing member is constituted by an elastic body.

9. The display device according to claim 1, wherein the supporting member contacts and supports the lower end section of the display panel.

10. The display device according to claim 1, wherein physical properties and shapes of the first shock-absorbing member and the second shock-absorbing member, and a length of the supporting member along a lower edge of the display panel, are set on the basis of characteristics of warping which occurs in the display panel due to change in a usage environment of the display device.

11. The display device according to claim 2, wherein the first shock-absorbing member is partially not arranged in the vicinity of the supporting member.

12. The display device according to claim 2, wherein the second shock-absorbing member is partially not arranged in the vicinity of the supporting member.

13. The display device according to claim 1, wherein the display panel is a liquid crystal panel.

14. A display device, comprising:
a display panel having a rectangular shape;
a supporting member which supports a portion of the lower end section of he display panel;
a first elastic member which supports a first surface of the display panel in a region along a lower edge; and
a plurality of second elastic members which support a second surface of the display panel which is on the opposite side of the first surface in a region along the lower edge,
wherein the plurality of second elastic members are disposed such that there is a gap at least at a position corresponding to a portion supported by a center portion of the supporting member.

15. The display device according to claim 14, wherein plurality of the supporting members are provided;
the plurality of supporting members are disposed at positions symmetrical about the center of the lower edge of the display panel; and
the plurality of the second elastic members is disposed such that there is a gap at a position corresponding to a center portion of each of the plurality of supporting members.

16. The display device according to claim 14, wherein the length along the direction parallel to the display panel of the gap between the plurality of second elastic members is longer than the length along the direction parallel to the display panel of a surface of the supporting member in contact with the display panel.

17. The display device according to claim 14, wherein the first surface is a front surface of the display panel and the second surface is a rear surface of the display panel.

* * * * *